(12) United States Patent
Sudjian

(10) Patent No.: US 6,628,145 B1
(45) Date of Patent: Sep. 30, 2003

(54) HIGH-SPEED LOGIC GATE

(75) Inventor: Douglas Sudjian, Santa Clara, CA (US)

(73) Assignee: Resonext Communications, Inc., San Jose, CA (US)

( * ) Notice: Subject to any disclaimer, the term of this patent is extended or adjusted under 35 U.S.C. 154(b) by 0 days.

(21) Appl. No.: 09/792,693

(22) Filed: Feb. 23, 2001

(51) Int. Cl.[7] .............................. H03K 19/094
(52) U.S. Cl. .............. 326/115; 326/104; 326/108; 326/127; 327/54
(58) Field of Search ............... 326/104, 115, 326/108, 127; 327/51, 52–54

(56) References Cited

U.S. PATENT DOCUMENTS

| | | | | |
|---|---|---|---|---|
| 4,329,597 A | * | 5/1982 | Yamagiwa | 326/127 |
| 4,516,039 A | * | 5/1985 | Matsuzaki et al. | 326/127 |
| 4,599,521 A | * | 7/1986 | Kanai et al. | 326/126 |
| 5,945,848 A | * | 8/1999 | Ali | 326/127 |
| 6,265,898 B1 | * | 7/2001 | Bellaouar | 326/29 |
| 6,285,262 B1 | * | 9/2001 | Kuriyama | 327/115 |

FOREIGN PATENT DOCUMENTS

| | | | | |
|---|---|---|---|---|
| JP | 55066132 A | * | 5/1980 | H03K/19/086 |
| JP | 02086321 A | * | 3/1990 | H03K/19/086 |

* cited by examiner

*Primary Examiner*—Karl D. Frech
*Assistant Examiner*—Steven S. Paik
(74) *Attorney, Agent, or Firm*—Dinh & Associates

(57) ABSTRACT

A logic gate that includes a first differential amplifier and a feedback circuit. The first differential amplifier has a number of first (e.g., non-inverting) inputs and a second (e.g., inverting) input, receives and senses input signals applied to the non-inverting inputs, and provides a differential output that is a particular logic function (e.g., an 'OR') of the input signals. The non-inverting inputs may correspond to the gates of a number of transistors coupled in parallel to form an OR function. The feedback circuit detects the (e.g., non-inverting node of the) differential output and provides a control signal for the inverting input of the first differential amplifier. The logic gate typically further includes a second differential amplifier that senses and further drives the differential output.

22 Claims, 10 Drawing Sheets

HIGH-SPEED LOGIC GATE

BACKGROUND OF THE INVENTION

The present invention relates generally to circuits. More particularly, it relates to a high-speed logic gate, such as an 'OR' gate, having improved switching performance and which may be used in various applications such as a prescaler for a frequency synthesizer.

Logic gates are commonly used to implement various logic functions. For example, OR gates may be used in conjunction with flip-flops to implement a dual modulus divider capable of dividing an oscillator signal by one of a number of divide factors (e.g., four and five). An example design of such dual modulus divider is described herein. For some applications (e.g., wireless, networking, and so on), the oscillator signal may be a radio frequency (RF) signal. The dual modulus divider is typically the fast operating logic, and may be required to operate based on the RF signal. In this case, if the dual modulus divider can be designed to operate faster, a higher oscillator frequency may be supported and new applications may be possible.

To increase the operating speed of the synchronous circuits such as the dual modulus divider, it is necessary to reduce the propagation delay of logic gates between synchronous elements. If a logic gate is inserted between stages of flip-flops, or implemented in feedback loops, additional delay is introduced which then limits the speed at which the flip-flops may be clocked.

As can be seen, high-speed logic gates, such as OR gate, having improved switching performance are highly desirable. These gates may be advantageous used for various high-speed logics such as a prescaler and other circuits required to operate at a high clock frequency.

SUMMARY OF THE INVENTION

The invention provides techniques to improve the operating speed and switching performance of a logic gate. Via the use of a (positive) feedback circuit, various improvements in performance may be obtained such as (1) faster signal swing on the output signal, (2) stronger output signal drive, (3) improved noise margin, and so on. The feedback circuit may be used to implement high-speed logic based on, for example, current-mode logic (CML). The improvements provided by the feedback circuit are especially advantageous for logic implemented in complementary metal oxide semiconductor (CMOS), which is inherently a slower process than some other processes such as bipolar and bipolar-CMOS.

An embodiment of the invention provides a logic gate that includes a first differential amplifier and a feedback circuit. The first differential amplifier has a number of first (e.g., non-inverting) inputs and a second (e.g., inverting) input, receives and senses input signals applied to the non-inverting inputs, and provides a differential output that is a particular logic function (e.g., an 'OR') of the input signals. The non-inverting inputs may correspond to the gates of a number of transistors coupled in parallel to form an OR function. The feedback circuit detects the (e.g., non-inverting node of the) differential output and provides a control signal for the inverting input of the first differential amplifier. The logic gate typically further includes a second differential amplifier that senses and further drives the differential output.

The feedback circuit can provide positive feedback between the output of the logic gate and the inverting input of the first differential amplifier. This feedback may provide various improvements in the signal characteristics. The control signal can dynamically adjust the inverting input of the first differential amplifier to provide improved switching performance. This dynamic adjustment can be achieved by driving the inverting input to a polarity that is opposite from an OR of the input signals applied to the non-inverting inputs.

The feedback circuit can be implemented with a third differential amplifier comprised of a pair of transistors having sources that couple together. One transistor has a gate that couples to the non-inverting output of the logic gate and a drain that couples to the inverting input of the first differential amplifier. The other transistor has a gate that can couple to a bias voltage, $V_B$, or to the inverting output of the logic gate, and a drain that can couple to a resistive or active load or $V_{CC}$.

Various other aspects, embodiments, and features of the invention are also provided, as described in further detail below.

The foregoing, together with other aspects of this invention, will become more apparent when referring to the following specification, claims, and accompanying drawings.

DESCRIPTION OF THE SPECIFIC EMBODIMENTS

Figure 1:
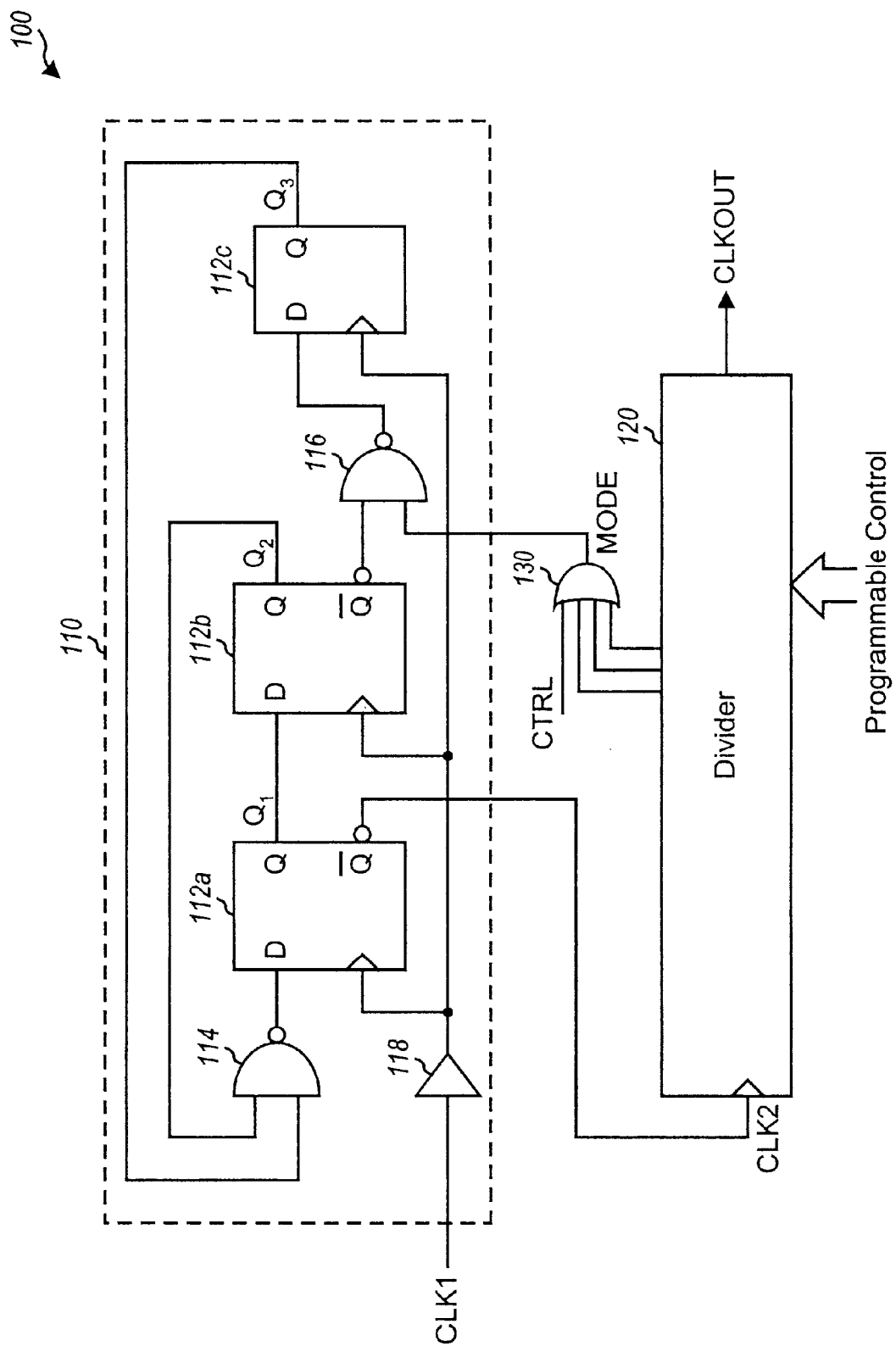
FIG. 1 is a block diagram of a design of a full dual modulus divider that may be used within a phase-locked loop (PLL) frequency synthesizer.

FIG. 1 is a block diagram of a design of a full dual modulus divider 100 that may be used within a phase-locked loop (PLL) frequency synthesizer. Dual modulus divider 100 divides an input clock signal, CLK1, by a factor of N using an upper partial dual modulus divider 110 operating in combination with a lower divider 120.

In the embodiment shown in FIG. 1, dual modulus divider 110 includes three D flip-flops 112a, 112b, and 112c coupled in series. A NAND gate 114 has two inputs that couple to the Q2 and Q3 outputs from D flip-flops 112b and 112c, respectively, and an output that couples to the D input of D flip-flop 112a. The output of latch 112a couples to the D input of latch 112b. A NAND gate 116 has one input that couples to the $\overline{Q2}$ output from D flip-flop 112b, another input that couples to the control signal, MODE, and an output that couples to the D input of D flip-flop 112c. The input clock signal, CLK1, is buffered by a buffer 118 and provided to the clock input of D flip-flops 112a, 112b, and 112c.

Dual modulus divider 110 is capable of dividing the input clock signal, CLK1, by either four or five depending on the value on a control signal, MODE. Dual modulus divider 110 can also divide (over many cycles) the input clock signal, CLK1, by an average value that is between 4 and 5 (i.e., 4<K<5) by dynamically adjusting the control signal, MODE.

The $\overline{Q}$ output from D flip-flop 112a is provided as a prescaled clock signal, CLK2, which is used to drive lower divider 120. Divider 120 divides the prescaled clock signal, CLK2, by a factor of M, where M can be any value one or greater. In the embodiment shown in FIG. 1, divider 120 further provides multiple feedback signals to control the operation of dual modulus divider 110. The signals are provided to the inputs of an OR gate 130 that may further receive an additional control signal, CTRL. Based on the received signals, OR gate 130 generates the control signal, MODE, used to direct dual modulus divider 110 to divide by either four or five. By dynamically controlling the divide-by-M operation of divider 120 and the divide-by-four or five operation of divider 110, any overall divide-by-N value may be achieved (where N need not be an integer). This allows the frequency synthesizer employing full dual modulus divider 100 to generate any desired output frequency.

As shown in FIG. 1, full dual modulus divider 100 includes OR gate 130 coupled between partial dual modulus divider 110 and lower divider 120. To operate at high frequency, the delay between the output of one D flip-flop and the input of the following D flip-flop should be minimized. As shown in FIG. 1, the prescaled clock signal, CLK2, is generated as the $\overline{Q}$ output from D flip-flop 112a, which is clocked with the input clock signal, CLK1. The prescaled clock signal, CLK2, is then used to clock lower divider 120 to generate the signals that are provided to OR gate 130. The output of OR gate 130 is further provided to the input of NAND gate 116, and the output of NAND gate 116 couples to the data input of D flip-flop 112c.

The speed at which D flip-flops 112a through 112c may be clocked is dependent on various delay associated with the signal path described above, and in particular the following delays: (1) delay from the clock to data output, $t_{CQ1}$, of D flip-flop 112a, (2) delay from the clock to the signal output, $t_{CQ2}$, of lower divider 120, (3) the propagation delay of OR gate 130 and NAND gate 116, and (4) the setup time, $t_{SU}$, for D flip-flop 112c.

The overall delay noted above can be reduced by designing D flip-flops to operate as fast as possible (under a given power consumption and process constraints), by integrating NAND gates 114 and 116 within D flip-flops 112a and 112c (as described in co-pending U.S. patent application Ser. No. (Attorney Docket No. 121-1)), and designing OR gate 130 to operate as fast as possible and having good switching characteristics (again, under the given power consumption and process constraints).

Figure 2:
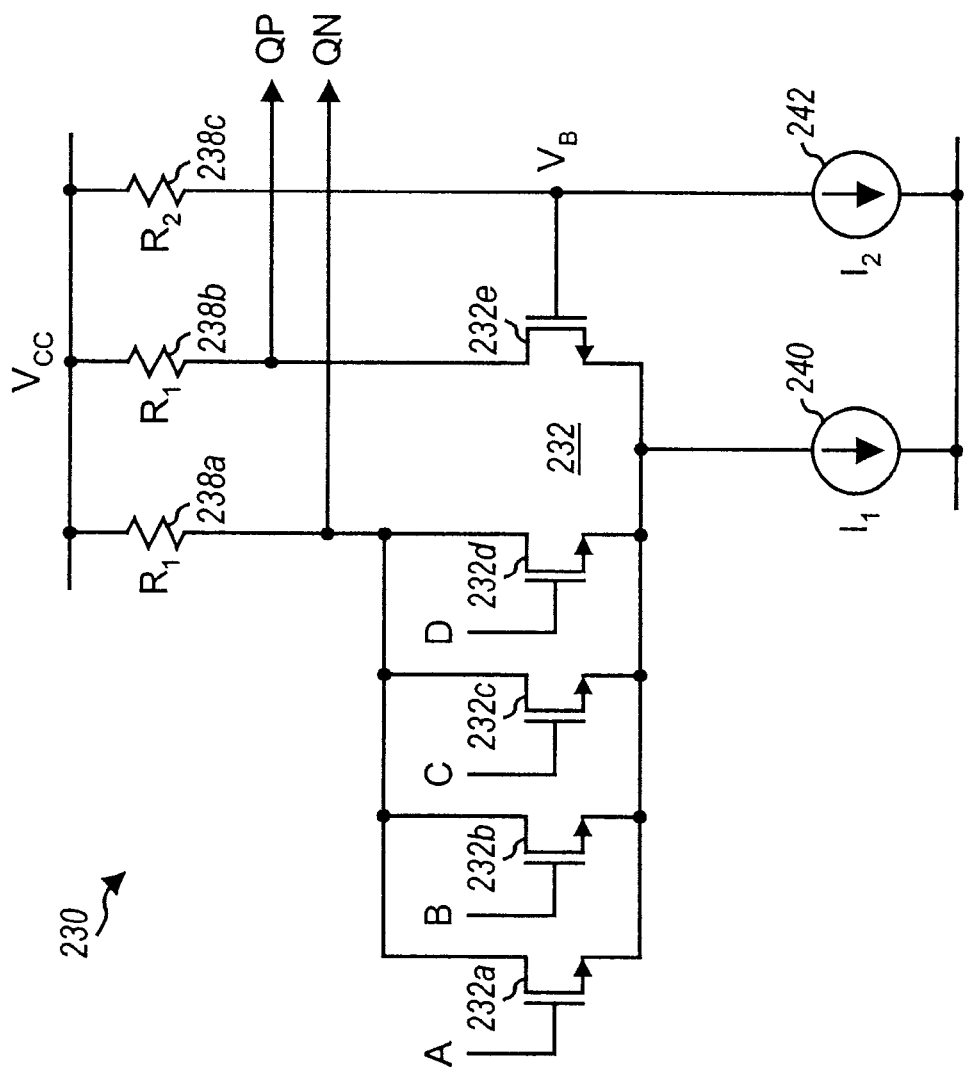
FIG. 2 is a schematic diagram of a specific design of a 4-input OR gate, which is one implementation of the OR gate in FIG. 1.

FIG. 2 is a schematic diagram of a specific design of a 4-input OR gate 230, which is one implementation of OR gate 130 in FIG. 1. In this design, OR gate 230 is implemented with complementary metal oxide semiconductor (CMOS) transistors and based on current-mode logic (CML). CMOS is preferred for many circuits because of its lower cost. However, CMOS typically has slower operating frequency in comparison to other processes such as bipolar-CMOS (Bi-CMOS), bipolar, and others. Current-mode logic is often used to implement logic circuits when faster operating speed and lower switching noise is desired (for a given process).

As shown in FIG. 2, OR gate 230 includes an "input" differential amplifier 232 having four N-channel transistors 232a, 232b, 232c, and 232d coupled in parallel and forming one leg of the differential amplifier, and a single N-channel transistor 232e forming the other leg of the differential amplifier. N-channel transistors 232a through 232e have sources that couple together and further to a current source 240. The gates of N-channel transistors 232a through 232d form the four inputs to OR gate 230, and the drains of these transistors couple together and to a load resistor 238a. The gate of N-channel transistor 232e couples to a bias voltage, $V_B$, and the drain of transistor 232e couples to a load resistor 238b. The bias voltage, $V_B$, is generated by a current source 242 coupled in series with a load resistor 238c. The drains of N-channel transistors 232a, 232b, 232c, 232d, and 232e form the differential output, QN and QP, for OR gate 230.

OR gate 230 operates as follows. The gate of N-channel transistor 232e is maintained at the bias voltage, $V_B$, which is the midpoint between the high and low voltages for the input signals, A through D. If any one of the input signals is at a high voltage, the N-channel transistor with this input signal turns on and pulls the inverted output, QN, to a low voltage. The output, QP, is complementary and transitions to high voltage if any one of the input signals is at high voltage. Conversely, if all input signals are at low voltage, N-channel transistors 232a through 232d are turned off and the inverted output, QN, transitions to high voltage. Again, the output, QP, is complementary and transitions to low voltage if all input signals are at low voltage. A truth table is also provided in FIG. 2, which shows the value on the non-inverting output, QP, versus the values on the input signals, A through D.

For the design shown in FIG. 2, OR gate 230 receives single-ended input signals. For current-mode logic, the load resistance (R) and the bias current (I) may be selected such that the output signal swing is approximately 300 mV peak-to-peak. The input signals, A through D, also conform to this design and have 300 mVpp signal swing. However, since the gate of N-channel transistor 232e is biased at the midpoint between the high and low voltages (e.g., −150 mV from $V_{CC}$, the differential voltage across the differential input of differential amplifier 232 is only & 150 mV, which is only half of the fall signal swing (300 mV) for the fully differential design. This smaller differential signal swing across the differential input of differential amplifier 232 results in switching degradation, as described below.

Figure 3A:
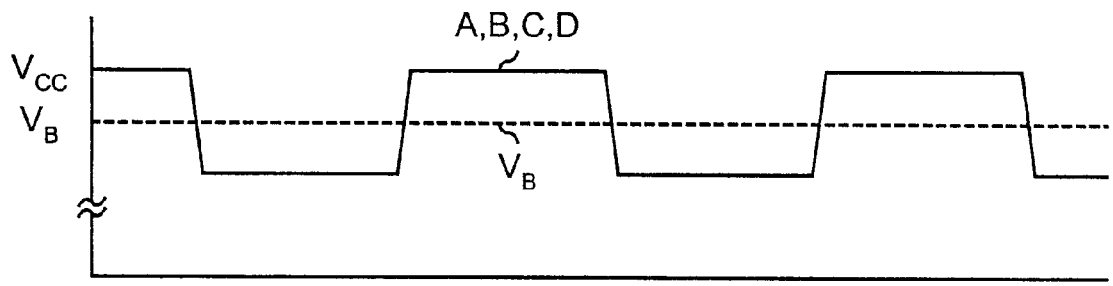
FIG. 3A is a diagram showing the voltages at the inputs of the differential amplifier within the OR gate.

FIG. 3A is a diagram showing the voltages at the inputs of differential amplifier 232. The gate of N-channel transistor 232e is maintained at the bias voltage, $V_B$, which is the midpoint between the high and low voltages for the input signals, A through D. The voltage on the inverting output, QN, is equal to $(V_{CC}-R \cdot I_1)$ if any one of N-channel transistor 232a through 232d is turned on, and is equal to $V_{CC}$ if all four N-channel transistors 232a through 232d are turned off. Thus, the midpoint voltage on QP and QN is $(V_B = V_{CC} - R_1 \cdot I_1)$. The gate of N-channel transistor 232e is biased to this midpoint voltage, $V_B$, which is generated with current source 242 having a current of $I_2$ (e.g., $I_2=I_1/2$) and a load resistor 238e having a resistance of $R_2$ (e.g., $R_2=R_1$).

Figure 3B:
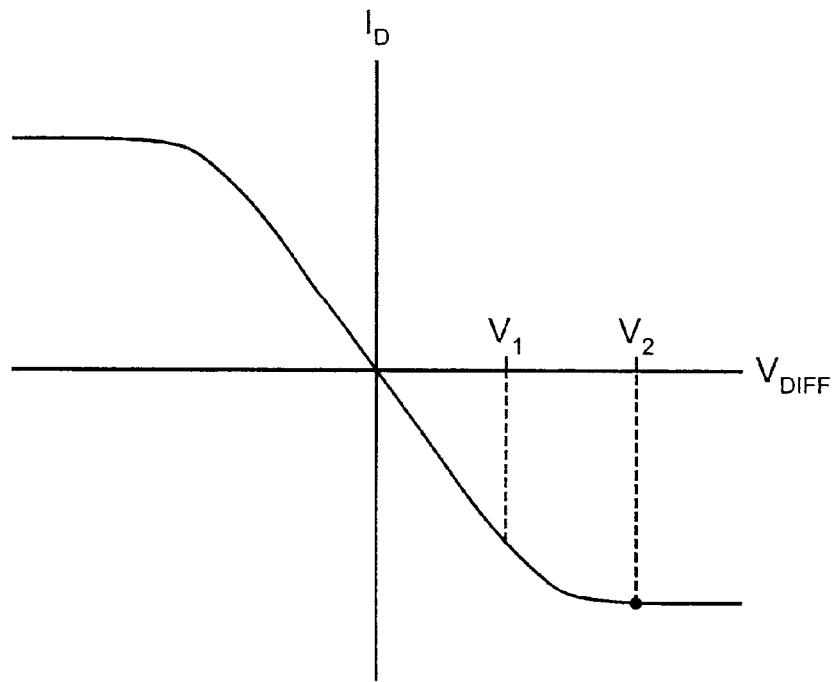
FIG. 3B is a plot of a transfer function for a CMOS differential amplifier.

FIG. 3B is a plot of a transfer function for a CMOS differential amplifier. The horizontal axis denotes the differential voltage across the differential input of the differential amplifier, with a positive value indicating that the voltage on the non-inverting input (e.g., the gates of N-channel transistors 232a through 232b, where the input signals A through B are applied) is greater than the voltage at the inverting input (e.g., the gate of N-channel transistor 232e). The vertical axis denotes the drain current through the differential amplifier, with a negative value indicating that the current is flowing across the inverting path (e.g., through N-channel transistor 232a through 232d) and a positive value indicating that the current is flowing across the non-inverting path (e.g., through N-channel transistor 232e). The transfer function is related to the $g_m$ of the CMOS transistor. The selected bias current ($I_1$), transistor sizes, and input signal differential swing may be optimized for a particular bandwidth, thus improving the differential characteristics of a particular stage. For instance, as seen in FIG. 3B, a larger signal swing across the differential input of the differential amplifier provides better switching performance in terms of more current drive (i.e., increased $I_D$).

When a differential input signal is applied across the differential input of the differential amplifier, a full signal swing ($V_2$, which may be 300 mV) is generated across the differential input. This larger differential input voltage causes the differential amplifier to switch more completely, which results in the voltages on the differential output, QP and QN, achieving larger signal swing. Conversely, when one input of the differential amplifier is biased at $V_B$ and a single-ended input signal is applied to the other input, the differential input swing would be reduced by one half ($V_1$, which may be 150 mV) across the differential input. This smaller differential input voltage causes the differential amplifier to switch less completely, which results in an increase in delay under output loading due to a reduction in signal switching current at the differential output, QP and QN. A different transfer function than the one shown in FIG. 3B may be obtained with different transistor sizes. Optimal performance results when the transistor sizes are minimized at a given bias current while still maintaining the signal switching bandwidth under the required loading conditions at the amplifier output.

Figure 3C:
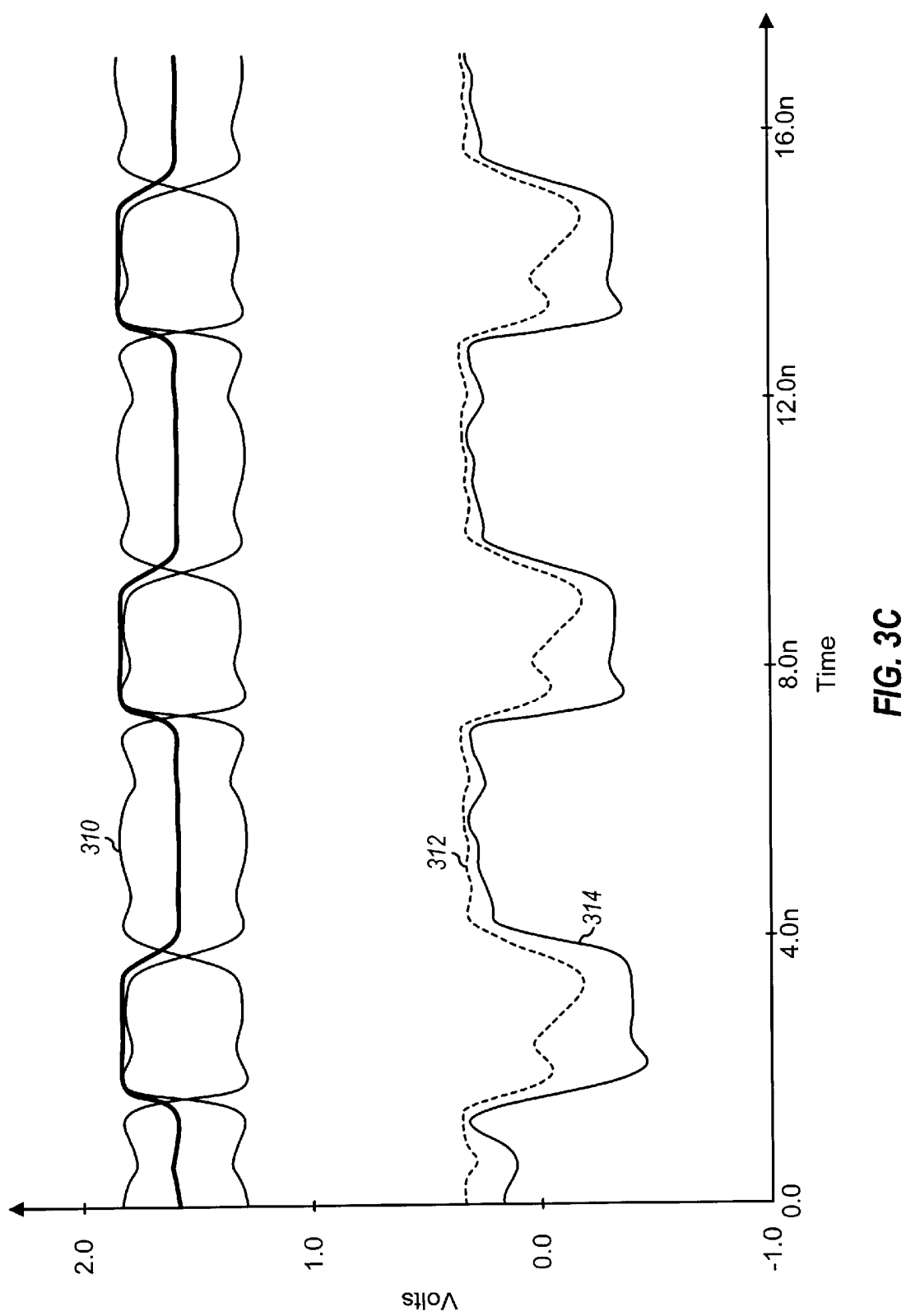
FIG. 3C is a plot illustrating the switching performance of the OR gate in FIG. 2.

FIG. 3C is a plot illustrating the switching performance of OR gate 230. In FIG. 3C, the horizontal axis denotes time, which is labeled in increments of 4.0 nsec, and the vertical axis denotes voltage. The single-ended input signal to the OR gate is shown by plot 310, and the different output signal (QP−QN) of the OR gate is shown by plot 312. Because the gate of N-channel transistor 232e is biased to midpoint voltage, $V_B$, the signal swing across the differential input of differential amplifier 232 is approximately half (in comparison to a fully differential input), and the switching performance of the output signal is degraded. Moreover, since a signal transition is applied to only one input of the differential amplifier while the other input is maintained at a fixed voltage (as oppose to both inputs being applied with signals of opposite polarity for a fully differential design), the switching speed of differential amplifier 232 is also slower. This degradation in switching performance is especially pronounced for high frequency applications.

For some applications (such as dual modulus divider 110 shown in FIG. 1), it is highly desirable to design an OR gate having faster operating speed and improved switching performance. For high-speed applications, the propagation delay of the OR gate may limit the frequency at which the synchronous elements (e.g., the D flip-flops) may be clocked. Moreover, the propagation delay introduced by the OR gate may be more detrimental for a CMOS process having inherently slower speed in comparison to other processes (e.g., bipolar).

An aspect of the invention provides a multi-input OR gate having faster operating speed and improved switching performance. The OR gate of the invention may be advantageously used in a numerous high-speed applications such as wireless, networking, and so on. The OR gate of the invention may also be advantageously used in numerous types of circuits such as, for example, a clock divider (i.e., a prescaler). As noted above, a prescaler is typically the fastest operating logic in a circuit and may be required to operate with (i.e., divide down) a high frequency RF signal. In this case, if the divider can be designed to operate faster, a higher oscillator frequency may be supported and new applications may be possible.

Figure 4:
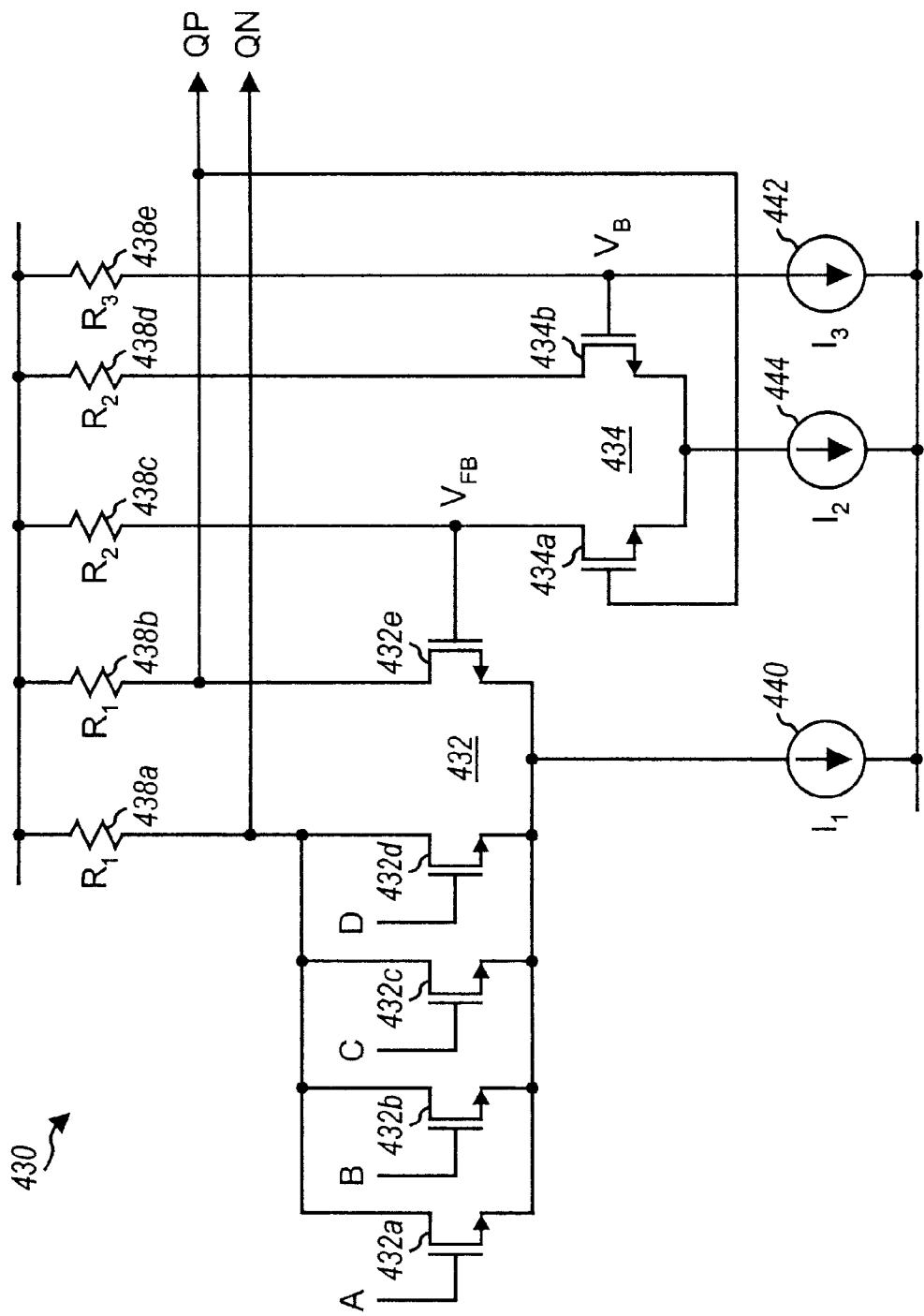
FIGS. 4, 5, and 6A are schematic diagrams of a design of an OR gate having faster operating speed and improved switching performance, in accordance with three embodiments of the invention.

FIG. 4 is a schematic diagram of a design of an OR gate 430 having faster operating speed and improved switching performance, in accordance with an embodiment of the invention. OR gate 430 includes an input differential amplifier 432 and a "feedback" differential amplifier 434. Input differential amplifier 432 implements the OR function and feedback differential amplifier 434 provides improved switching performance for the OR gate.

Input differential amplifier 432 is configured similar to input differential amplifier 232 in FIG. 2, and includes four N-channel transistors 432a, 432b, 432c, and 432d coupled in parallel and forming one leg of the differential amplifier, and a single N-channel transistor 432e forming the other leg of the differential amplifier. Feedback differential amplifier 434 includes N-channel transistors 434a and 434b having sources that coupled together and further to a current source 444. The gate of N-channel transistor 434a couples to the non-inverting output, QP, and the drain couples to a load resistor 438c and further provides the feedback signal, $V_{FB}$, for the gate of N-channel transistor 432e. The gate of N-channel transistor 434b couples to the bias voltage, $V_B$, generated by a current source 442 coupled in series with a load resistor 438e. And the drain of N-channel transistor 434b may or may not couple to a load resistor 438d.

Input differential amplifier 432 operates in similar manner as differential amplifier 232 in FIG. 2. If any one of the four N-channel transistors 432a through 432d is turned on by a high input signal, the inverting output QN is pulled to a low voltage and the non-inverting output QP transitions to a high voltage. Conversely, if all four N-channel transistors 432a through 432d are turned off by low input signals, QN is at high voltage and QP transitions to low voltage.

Feedback differential amplifier 434 dynamically adjusts the voltage at the gate of N-channel transistor 432e during a signal transition to improve switching performance. If the input signals A through D are all at low voltage, N-channel transistors 432a through 432d are all turned off, which causes the inverting output QN to be at high voltage and the non-inverting output QP to be at low voltage. The low voltage on QP turns off N-channel transistor 434a, which then causes the voltage at the gate of N-channel transistor 432e to transition high.

Thereafter, if any one of the input signals A through D switches to high voltage, one or more of N-channel transistor 432a through 432d turn on, which begin to pull the voltage on the inverting output QN lower and cause the non-inverting output QP to transition high. The higher voltage on QP turns on N-channel transistor 434a, which then pulls the voltage at the gate of N-channel transistor 432e low. The low voltage on the gate of N-channel transistor 432e and the high voltage on the gate of one or more N-channel transistors 432a through 432d result in a full differential signal swing being applied across the differential input of differential amplifier 432. This full differential swing improves the switching performance on the differential output, QP and QN. Differential amplifier 434 thus effectively provides positive feedback to cause QP to quickly transition from low to high voltage when any one of the input signals transitions high.

Conversely, when all input signals A through D transition back to low voltage, N-channel transistors 432a through 432d are turned off, and current is forced through N-channel transistor 432e. This then causes the voltage on QP to be pulled lower, which then turns off N-channel transistor 434a and causes the gate of N-channel transistor 432e to go high. Again, positive feedback is applied to cause QP to quickly transition from high to low voltage when the input signals transition low.

Feedback differential amplifier 434 may be viewed as a feedback circuit having an (inverting) input and an output. The inverting input of the feedback circuit is formed by the gate of N-channel transistor 434a and the output is formed by the drain of N-channel transistor 434a. Feedback differential amplifier 434 provides a signal inversion between QP, which is applied to the inverting input, and the output. Similarly, N-channel transistor 432e provides a signal inversion between the gate input and the drain output. Thus positive feedback is generated around the feedback loop (i.e., from QP, through N-channel transistor 434a, further through N-channel transistor 432e, and back to QP).

Feedback differential amplifier 434 can be biased with the same or different amount of current than for input differential amplifier 432. To avoid latch-up, differential amplifier 432 is biased stronger than differential amplifier 434. Also, the size of N-channel transistors 434a and 434b can be different from that of N-channel transistors 432a through 432d. A larger size for N-channel transistor 434a allows differential amplifier 434 to switch faster, but results in more capacitive loading on the drain of N-channel transistor 432e.

Feedback differential amplifier 434 improves the switching performance of OR gate 430 and further improves the characteristics of the differential output signal, QP and QN. First, faster signal swing on the output signal is achieved through the use of (positive) feedback to dynamically adjust the voltage on the inverting input (i.e., the gate of N-channel transistor 432e) during a signal transition. This effectively reduces the propagation delay of OR gate 430 and allows it to operate in a high frequency environment. Second, the output signal (and thus the next stage) is driven harder because a full differential voltage is provided across the differential input of differential amplifier 432. This results in more efficient current steering between the two paths of differential amplifier 432, which further results in a faster rate of change in the voltages on load resistors 438a and 438b. Third, improved noise margin is achieved for the output signal because of the larger output signal swing. Additional benefits may also be realized with the use of the feedback circuit of the invention.

FIG. 3C includes a plot 314 that illustrates the switching improvement for OR gate 430 with the use of feedback differential amplifier 434. When plot 314 (with feedback) is compared to plot 312 (without feedback), the improvement in switching performance is readily apparent, especially for high frequency applications. The signal swing for plot 314 is also larger than that for plot 312, with the larger signal swing resulting from a larger input voltage swing being applied at the differential input, which then leads to more current being provided across the load.

Figure 5:
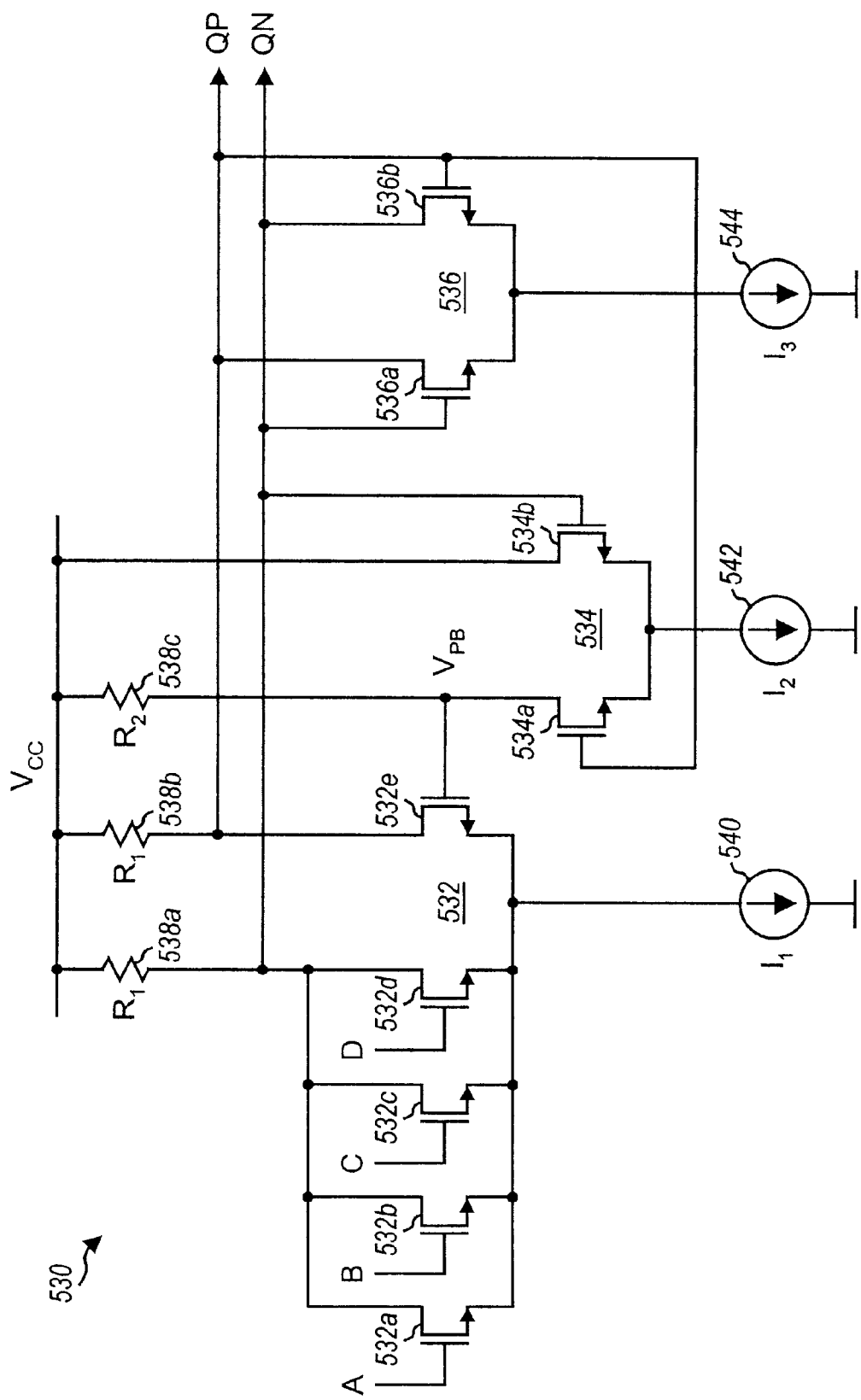

FIG. 5 is a schematic diagram of a design of an OR gate 530, in accordance with another embodiment of the invention. OR gate 530 includes an input differential amplifier 532, a feedback differential amplifier 534, and an "output" differential amplifier 536.

Input differential amplifier 532 is configured similar to input differential amplifier 432 in FIG. 4, and also includes four N-channel transistors 532a, 532b, 532c, and 532d coupled in parallel and forming one leg of the differential amplifier and a single N-channel transistor 532e forming the other leg of the differential amplifier. Feedback differential amplifier 534 is configured similar to feedback differential amplifier 434 in FIG. 4, and includes N-channel transistors 534a and 534b having sources that coupled together and further to a current source 542, gates that respectively couple to QP and QN, and drains that respectively couple to load resistor 538c and $V_{CC}$. This configuration for feedback differential amplifier 534 is different from the configuration for feedback differential amplifier 434 in FIG. 4. The gate of N-channel transistor 534b is coupled to QN (instead of $V_B$) and the drain of N-channel transistor 534b is coupled directly to $V_{CC}$ (instead of through a load).

Output differential amplifier 536 includes N-channel transistors 536a and 536b having sources that couple together and to a current source 544, gates that respectively couple to QN and QP, and drains that respectively couple to QP and QN.

Input differential amplifier 532 operates in similar manner as differential amplifier 432 in FIG. 4. If any one of the four N-channel transistors 532a through 532d is turned on by a high input signal, QN is pulled to low voltage and QP transitions to high voltage. Conversely, if all four N-channel transistors 532a through 532d are turned off by low input signals, QN is at high voltage and QP transitions to low voltage.

Feedback differential amplifier 534 also operates in similar manner as differential amplifier 434 in FIG. 4. Feedback differential amplifier 534 dynamically adjusts the voltage at the gate of N-channel transistor 532e during a signal transition to improve switching performance. The feedback configuration shown in FIG. 5 provides a full differential swing across the differential input of differential amplifier 534 when it is being switched, which may provide improved switching performance. However, the switching improvement due to a larger signal swing may be negated by the extra capacitive loading of the gate of N-channel transistor 534b on QN. For certain operating conditions, the feedback configuration shown in FIG. 5 may provide improved switching performance over the configuration shown in FIG. 4.

Output differential amplifier 536 senses the transition in the differential output, QP and QN, and further speeds up the transition. As a voltage develops across the differential output, the voltage is applied across the gates of N-channel transistors 536a and 536b, which then turns on and off the appropriate transistors that further pull the differential output toward the final value.

In the embodiment shown in FIG. 5, differential amplifiers 532, 534, and 536 are shown biased with currents of $I_1$, $I_2$, and $I_3$, respectively. These currents are selected based on various considerations such as improved operating performance, reduced power consumption, and so on. The current $I_3$ is also designed to be smaller than $I_1$ to allow the input signals to initiate differential amplifier 532 to switch state when the input signals change value.

Figure 6A:
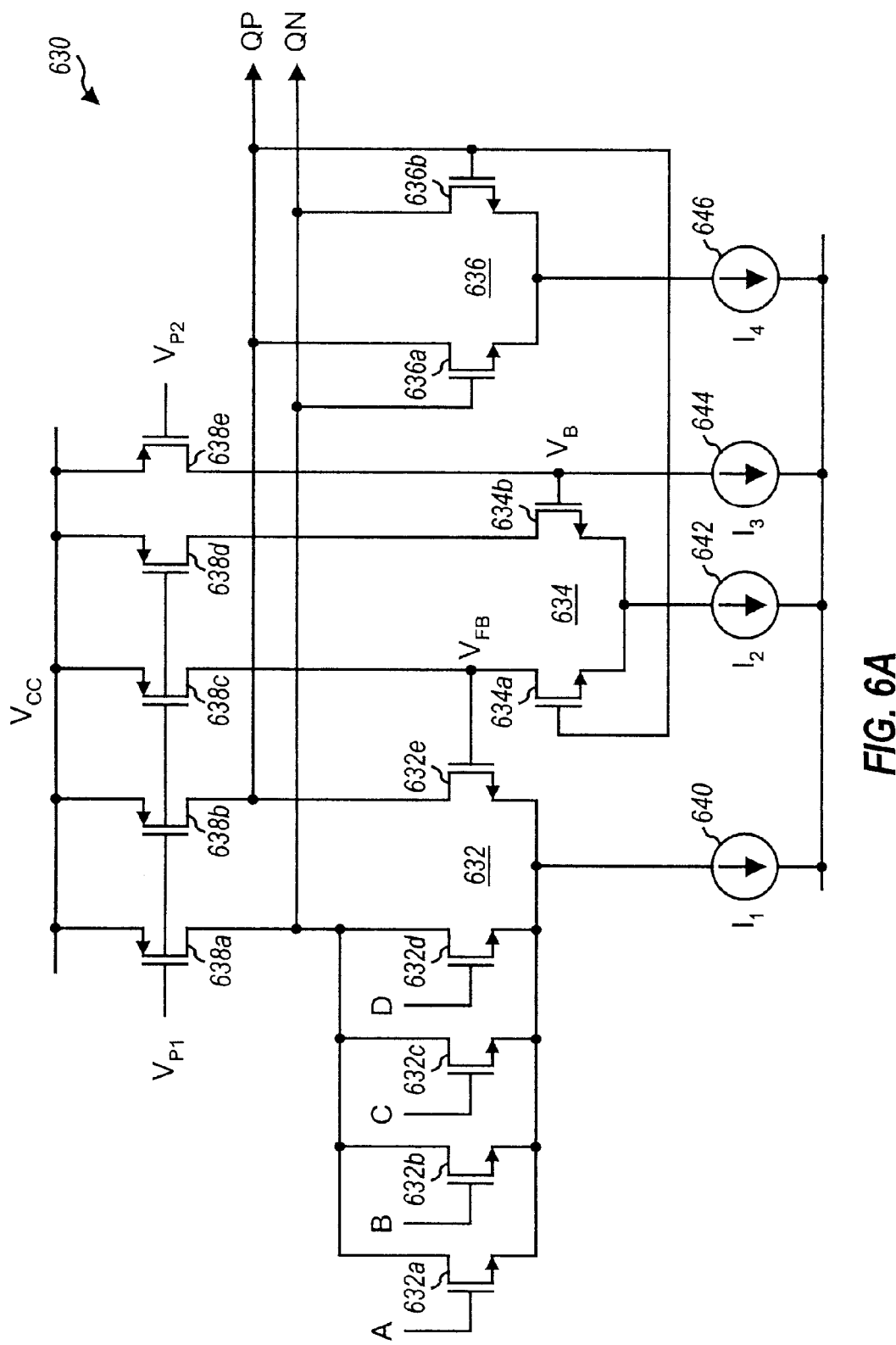

FIG. 6A is a schematic diagram of a design of an OR gate 630 with active load, in accordance with yet another embodiment of the invention. OR gate 630 includes an input differential amplifier 632, a feedback differential amplifier 634, and an output differential amplifier 636. Differential amplifiers 632, 634, and 636 are configured similar to differential amplifiers 532, 534, and 536 in FIG. 5, respectively. However, OR gate 630 includes active loads biased in the triode region for differential amplifiers 632 and 634, which may be preferred for some designs.

As shown in FIG. 6A, the active loads are provided by P-channel transistors 638a, 638b, 638c, and 638d having sources that couple to $V_{CC}$, gates that couple together and to a control voltage, $V_P$, and drains that respectively couple to the drains of N-channel transistors 632a through 632e, 634a, and 634b. The control voltage, $V_P$, is generated by a replica bias circuit (described below) such that when the amount of required current flowing in the active circuit equals that in the replica stage, the common gate voltage ($V_{P1}$, controls the drain voltages to a predefined level.

The active loads for the differential amplifiers may be advantageous for some designs and for some applications (e.g., for a fully CMOS digital process with no resistors). The active loads may provide improved switching performance under some operating conditions and may be easier and less costly to implement than resistive loads. The active loads may further provide more accurate output voltages than resistive loads, due to limitation in obtaining accurate resistor values in a CMOS process. In certain other designs and applications, resistive loads may result in less capacitive loading and may thus provide better performance. Different designs, layouts, and processes may provide different results and performance for active and resistive loads. The choice as to whether to use a resistive or active load may be dependent on various factors such as cost, performance, and others. The invention may be implemented with either active or resistive loads.

Figure 6C:
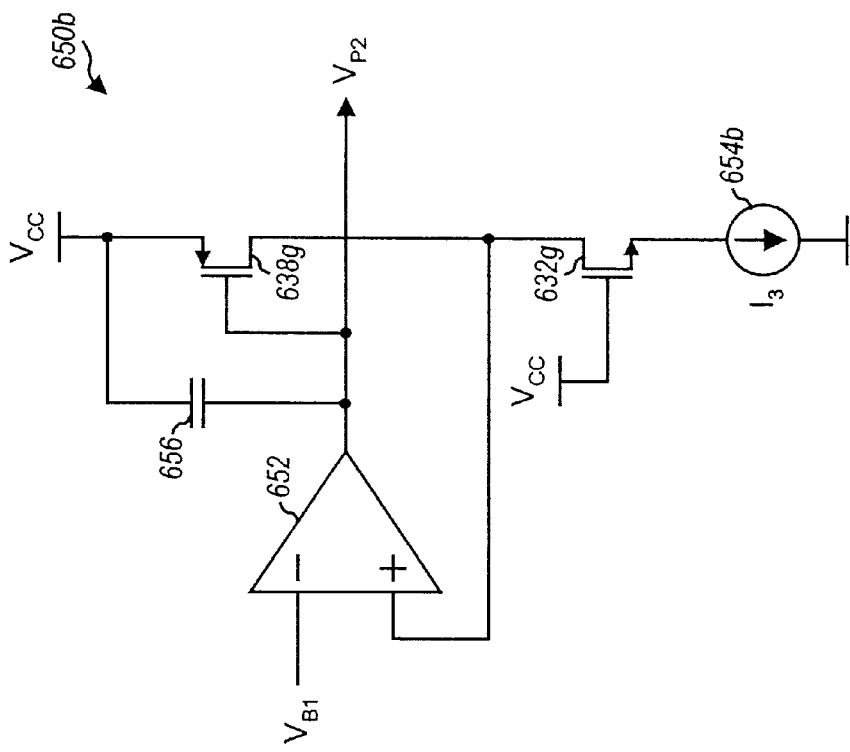
FIGS. 6B and 6C are schematic diagrams of an embodiment of replica bias circuits for generating the control voltages for the active loads in FIG. 6A.
Figure 6B:
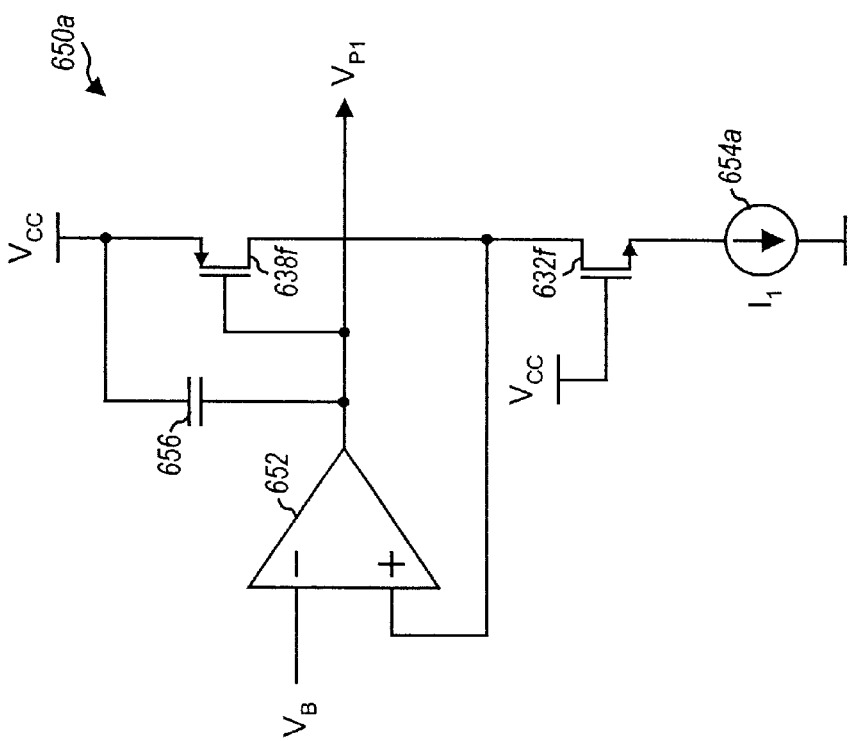

FIGS. 6B and 6C are schematic diagrams of an embodiment of replica bias circuits 650a and 650b for generating the control voltages, $V_{P1}$ and $V_{P2}$, respectively, for the active loads in FIG. 6A. Replica bias circuit 650a provides a control voltage, $V_{P1}$, for active load 638a through 638d, and includes an operational amplifier (op-amp) 652, a P-channel transistor 638f, an N-channel transistor 632f, and a current source 654a. P-channel transistor 638f is a replica of one of P-channel transistor 638a, 638b, 638c, and 638d, which forms the active load for differential amplifier 632 in FIG. 6A. N-channel transistor 632f is a replica of one of N-channel transistor 632e of differential amplifier 632.

P-channel transistor 638f has its source coupled to $V_{CC}$, its gate coupled to the output of op-amp 652, and its drain coupled to the drain of N-channel transistor 632f. The gate of N-channel transistor 632f couples to $V_{CC}$, and the source couples to current source 654a. Op-amp 652 is coupled in a negative feedback loop with transistors 632f and 638f, and has its inverting input coupled to the bias voltage, $V_B$, and its non-inverting input coupled to the drains of transistors 632f and 638f. The output of op-amp 652 comprises the control voltage, $V_{P1}$. A capacitor 656 couples to the output of op-amp 652 and AC ground provides filtering and compensation for the control voltage, $V_{P1}$.

Replica bias circuits 650a (and 650b) operate as follows. The gate of N-channel transistor 632f (632g) is maintained at $V_{CC}$. Op-amp 652 senses the voltage at the drain of N-channel transistor 632f (632g), compares this voltage with the bias voltage, $V_B$ ($V_{B1}$), at its inverting input, and generates the control voltage, $V_{P1}$ ($V_{P2}$), for application to the gate of P-channel transistor 638f (638g) such that the voltage at the drain of N-channel transistor 632f (632g) is maintained at $V_B$ ($V_{B1}$). The control voltage, $V_{P2}$, thus maintains the mid-point between the high and low voltages on the output, QP and QN, at the bias voltage, $V_{B1}$. The control voltage, $V_{P1}$, provides the proper gate voltage to P-channel transistor 638f (which is operated in the triode region) such that the source-to-drain voltage, $V_{DS}$, generates the desired voltage drop from the supply voltage, $V_{SS}$, i.e., $V_{P1} \rightarrow (V_{DS}=V_{CC}-V_B \cong 300$ mV) and $V_{P2} \rightarrow (V_{DS} \cong 150$ mV).

Referring back to FIG. 6A, the drain to source voltage of transistor 638f in replica bias circuit 650 is also established in the active circuit of OR gate 630 when the same bias current, $I_1$, flows through any one of transistors 638a through 638d. Thus, a well-defined voltage level in the load is generated for proper signal propagation. For the schematic diagram shown in FIG. 6A, current sources 640 and 642 should be equal, and current source 654b should be equal to current source 644.

Figure 7:
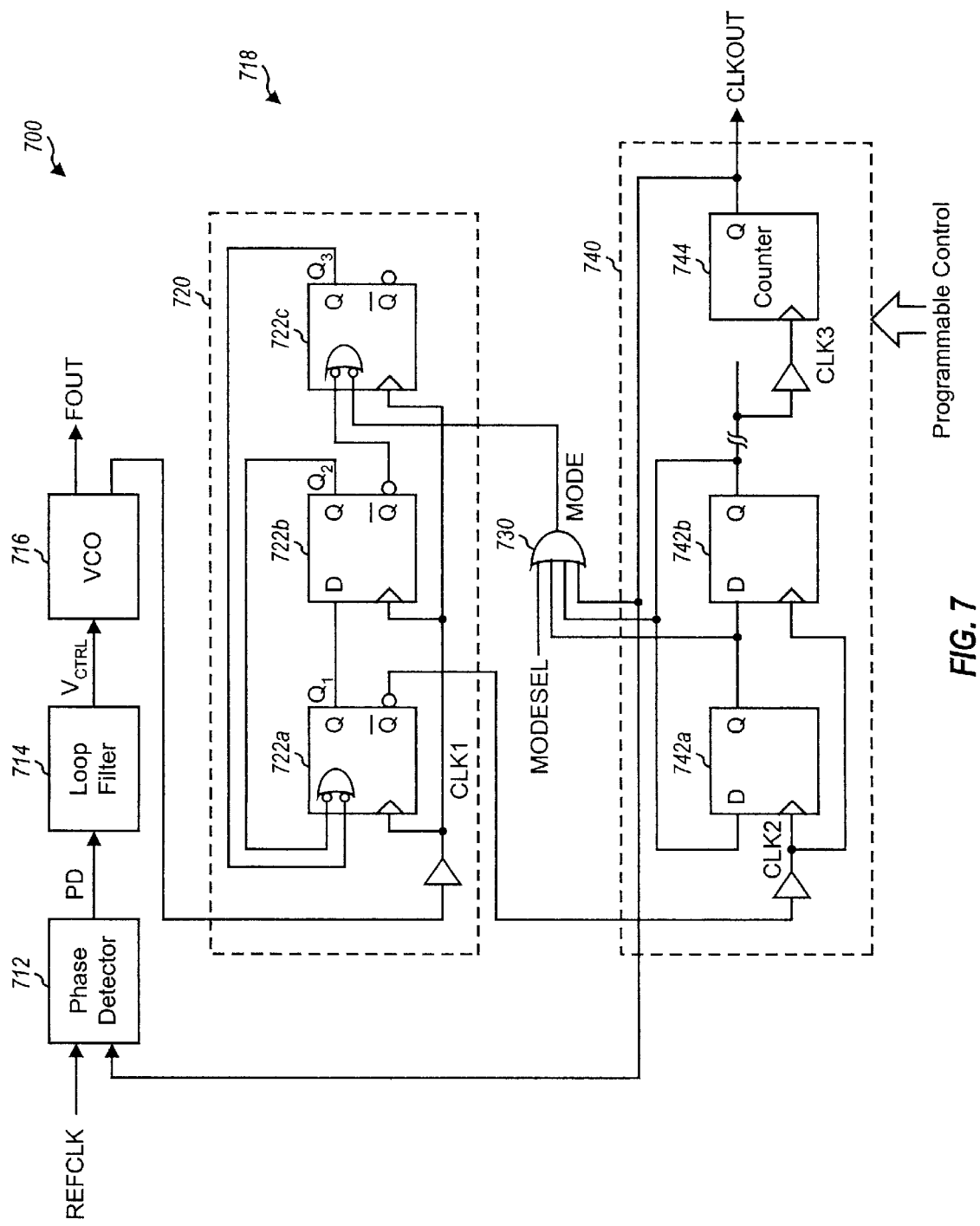
FIG. 7 is a block diagram of a phase-locked loop frequency synthesizer utilizing the improved OR gate of the invention.

FIG. 7 is a block diagram of a phase-locked loop (PLL) frequency synthesizer 700 utilizing the improved OR gate of the invention. Frequency synthesizer 700 may be employed in various applications such as a wireless, networking, and so on. Frequency synthesizer 700 may be used to generate a local oscillator (LO) signal, FOUT, and/or an output clock signal, CLKOUT, which are locked to a reference clock signal, REFCLK.

As shown in FIG. 7, frequency synthesizer 700 includes a phase detector 712, a loop filter 714, a voltage controlled oscillator (VCO) 716, and a full dual modulus divider 718. Divider 718 includes a partial dual modulus divider 720, an OR gate 730, and a lower divider 740 operated to provide a divide-by-N of a clock signal.

Phase detector 712 receives the reference clock, REFCLK, and a divided clock from divider 740, compares the two received clocks, and provides an output, PD, indicative of the difference in phase or frequency between the two received clocks. Loop filter 714 receives and filters the phase detector output, PD, with a particular lowpass filter and provides a control signal, $V_{CTRL}$. VCO 716 receives the control signal, $V_{CTRL}$, and adjusts its frequency of oscillation based on the control signal. VCO 716 further provides the LO signal, FOUT, which may be a buffered (and possibly a divided down) version of the internal clock signal. VCO 716 also provides to divider 720 the clock signal, CLK1, which is another buffered and (possibly divided down) version of the internal clock signal.

In the embodiment shown in FIG. 7, dual modulus divider 720 includes three D flip-flops 722a, 722b, and 722c coupled in series. D flip-flops 722a and 722c each includes an integrated 2-input OR gate at its data input, which is symbolically shown by the OR gate within the D flip-flop in FIG. 7. The OR gate in D flip-flop 722c implements NAND gate 116 in FIG. 1. Dual modulus divider 720 can divide the clock signal, CLK1, by either four or five, depending on a control signal, MODE, provided by divider 720. Dual modulus divider 720 can also divide (over many cycles) the clock signal, CLK1, by an average value K that is between 4 and 5 (i.e., 4<K<5) by dynamically adjusting the control signal, MODE.

The Q output from D flip-flop 722a is buffered and provided as a prescaled clock signal, CLK2, which is used to drive lower divider 740. In the embodiment shown, divider 740 includes two D flip-flops 742a and 742b coupled in series and configured to divide the prescaled clock signal, CLK2, by a factor of four. The output from D flip-flop 742b is provided as also buffered and provided as a clock signal, CLK3, which is used to drive the next divider chain symbolically represented by a counter 744.

In the embodiment shown in FIG. 7, the outputs from D flip-flops 742a and 742b and counter 744 are provided to three inputs of an OR gate 730. OR gate 730 further receives at its fourth input a control signal, MODESEL, which determines the divide ratio for the divider 718.

Generally, divider 740 can be designed to divide the prescaled clock signal, CLK2, by a factor of M, where M can be any value one or greater (M≧4 in the example shown in FIG. 7). Divider 740 further provides the signals that control the operation of dual modulus divider 720 (i.e., to divide by either four or five) via the control signal, MODE. By dynamically controlling the divide-by-M operation of divider 740 and the divide-by-four or five operation of divider 740, any overall divide-by-N value may be achieved (where N need not be an integer). This allows frequency synthesizer 700 to generate any desired output frequency. VCO 716 may be designed with the capability to tune within a particular frequency range (i.e., Δf), and the divide-by-N operation of divider 720 may be selected to generate LO and output clock signals at various frequencies (e.g., corresponding to different channel spacing).

Dual modulus divider 720 is equivalent to dual modulus divider 110 in FIG. 1, but includes several improvements. NAND gate 114 in divider 110 is implemented with an "inverted input" OR gate within D flip-flop 722a. The inverted input is achieved by taking the $\overline{Q}$ signals (instead of the Q signals) from D flip-flops 722b and 722c. And NAND gate 116 in divider 110 is implemented with an inverted input OR gate within D flip-flop 722c. By integrating NAND gates 114 and 116 in dual modulus divider 110 within D flip-flops 722a and 722c, respectively, in dual modulus divider 720, propagation delay is reduced and D flip-flops 722 may be operated at a higher input clock frequency.

OR gate 730 can be implemented using any one of the embodiments shown in FIG. 4, 5, or 6A. With the OR gate design of the invention, faster operation is possible. By employing a feedback circuit in the implementation of the OR gate, improved switching performance is obtained and the OR gate may be operated at higher frequency. These improvements allow for the design of a high-speed frequency synthesizer capable of operating at a higher frequency or with more margin and is especially advantageous in the (relatively) slower CMOS process.

Figure 8:
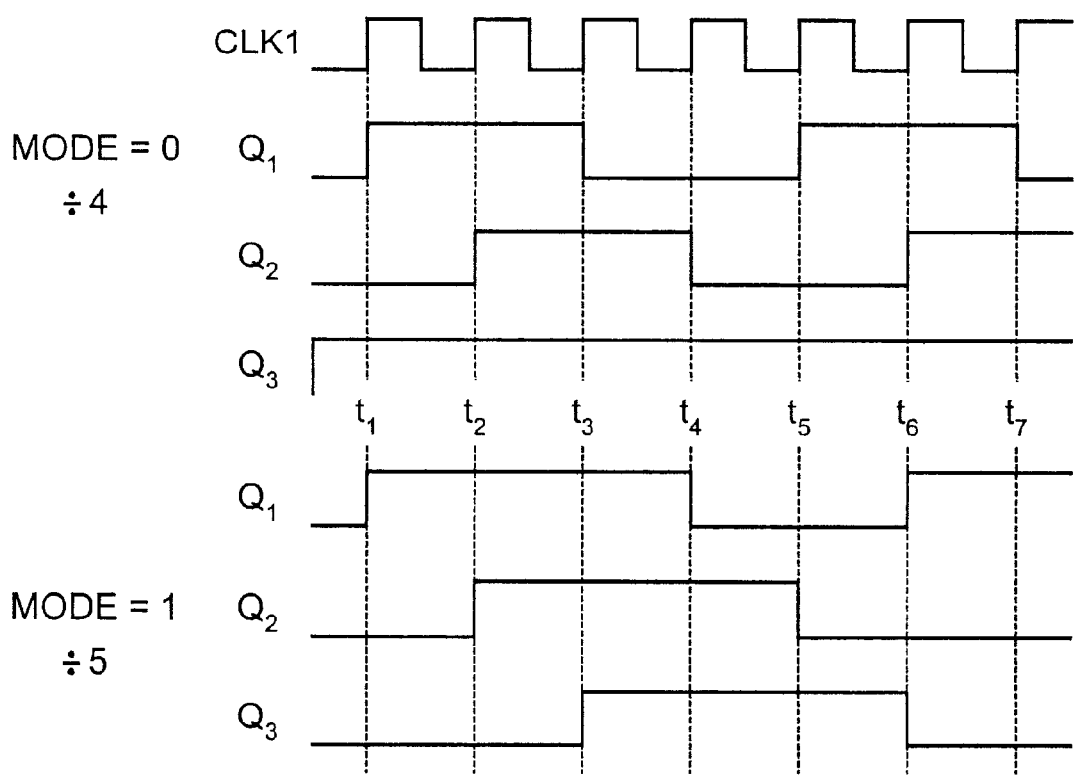
FIG. 8 is a timing diagram illustrating the operation of the dual modulus divider in FIG. 7.

FIG. 8 is a timing diagram illustrating the operation of dual modulus divider 720. When the control signal, MODE, is at logic high, the OR gate within D flip-flop 722c is effectively disabled (i.e., the output of the OR gate is maintained at logic high) and the $\overline{Q3}$ output of D flip-flop 722c is maintained at logic low. In this mode, D flip-flop 722c is not part of the feedback loop for dual modulus divider 720. Alternatively, when the control signal, MODE, is at logic low, the OR gate within D flip-flop 722c is effectively enabled and the Q3 output of the D flip-flop is based on the Q2 output from the preceding D flip-flop 722b. In this mode, D flip-flop 722c becomes part of the feedback loop for dual modulus divider 720.

The upper half of FIG. 8 shows the signals for the divide-by-four mode (i.e., MODE=logic low). Initially, the Q1 and Q2 outputs from D flip-flops 722a and 722b are reset to logic low. At time ti, a logic high (generated by Q2 being at logic low) is clocked into D flip-flop 722a. This high value is then clocked into D flip-flop 722b at time $t_2$. Since Q2 is now at logic high, the output of D flip-flop 722a transitions to logic low at the next positive clock edge, at time $t_3$. And at time $t_4$, the logic high at Q2 corresponds to a second logic low at the output of D flip-flop 722b. The resulting state of D flip-flops 722a, 722b, and 722c is returned to that at time $t_1$, and the timing sequence repeats. The divide-by-four is thus achieved by generating two consecutive high values with D flip-flops 722a and 722b (e.g., at times $t_1$ and $t_2$), inverting the second high value (between times $t_2$ and $t_3$), generating two low values with D flip-flops 722a and 722b (at times $t_3$ and $t_4$), inverting the second low value (between times $t_4$ and $t_5$), and so on.

The lower half of FIG. 8 shows the signals for the divide-by-five mode (i.e., MODE=logic high). Initially, the Q1, Q2, and Q3 outputs from D flip-flops 722a, 722b, and 722c are reset to logic low. At time $t_1$, a logic high is clocked into D flip-flop 722a. This high value is then clocked into D flip-flop 722b at time $t_2$ and into D flip-flop 722c at time $t_3$. When Q2 and Q3 are both at logic high, a low value is clocked into D flip-flop 722a at time $t_4$. And at time $t_5$, Q2 and Q3 are both still at logic high, a second low value is clock into D flip-flop 722a. At the next clock cycle, Q2 has transitioned to logic low, and a logic high is clocked into D flip-flop 722a, at time $t_5$. The divide-by-five is thus achieved by rippling three consecutive high values through D flip-flops 722a, 722b, and 722c, and rippling two consecutive low values through the D flip-flops.

For clarity, various aspects of the invention have been described for an implementation within an OR gate. These techniques may also be applied to the design of other types of gates and this is within the scope of the invention. For example, a NAND gate may be designed with P-channel transistors for the input differential amplifier, a NOR gate may be designed by applying the input signals to N-channel transistors on the inverting input of the input differential amplifier, and so on.

The high-speed OR gate have also been described using CMOS designs. However, the techniques described herein may also be applied to gates implemented using other types of transistors such as, for example, bipolar, GaAs, and others.

The high-speed OR gate may be used for various applications including wireless, networking, and other applications. The feedback circuit within the OR gate described herein can provide improved switching performance, especially for high frequency applications and low voltage designs (e.g., low voltage differential signal (LVDS)). The high-speed OR gate may be used in various logic functions, and the prescaler described herein is an example application. The high-speed OR gate may be employed in an RF circuit, an application specific integrated circuit (ASIC), a digital signal processor, a microprocessor, a controller, a memory device, and so on.

The foregoing description of the specific embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein, and as defined by the following claims.

What is claimed is:

1. A logic gate comprising:
    a first differential amplifier having a plurality of first inputs and a second input, the first differential amplifier configured to receive and sense input signals applied to the plurality of first inputs and provide a differential output that is a particular logic function of the input signals; and a feedback circuit operatively coupled to the first differential amplifier and configured to detect the differential output and provide a control signal, derived based on the detected differential output, for the second input of the first differential amplifier.

2. The logic gate of claim 1, wherein the plurality of first inputs is formed by gates of a plurality of transistors configured to implement the particular logic function.

3. The logic gate of claim 2, wherein the plurality of transistors coupled in parallel to form an OR function for the input signals.

4. The logic gate of claim 1, wherein the control signal dynamically adjusts the second input of the first differential amplifier during an input signal transition to provide improved switching performance.

5. The logic gate of claim 1, wherein the control signal dynamically adjusts the second input of the first differential amplifier to a voltage opposite in polarity from a voltage generated by the particular logic function of the input signals.

6. The logic gate of claim 1, wherein feedback circuit provides positive feedback between the differential output and the second input of the first differential amplifier.

7. The logic gate of claim 1, further comprising:

a second differential amplifier operatively coupled to the first differential amplifier and configured to sense and further drive the differential output.

8. The logic gate of claim 1, and implemented in complementary metal oxide semiconductor (CMOS).

9. The logic gate of claim 1, and implemented using current-mode logic (CML).

10. A logic gate comprising:

a first differential amplifier having a plurality of first inputs and a second input, the first differential amplifier configured to receive and sense input signals applied to the plurality of first inputs and provide a differential output that is a particular logic function of the input signals; and a feedback circuit operatively coupled to the first differential amplifier and configured to detect the differential output and provide a control signal for the second input of the first differential amplifier, wherein the feedback circuit is implemented as a second differential amplifier.

11. The logic gate of claim 10, wherein the second differential amplifier includes an inverting input and an output, wherein the inverting input of the second differential amplifier couples to a non-inverting node of the differential-output, and wherein the output of the second differential amplifier couples to the second input of the first differential amplifier.

12. A logic gate comprising:

a first differential amplifier comprising first, second, and third transistors, wherein the first and second transistors are configured to implement a particular logic function, wherein the first and third transistors have sources that couple together, gates that respectively form non-inverting and inverting gate inputs, and drains that respectively form inverting and non-inverting gate outputs, and wherein the inverting gate input is not coupled to the inverting or non-inverting gate output;

a current source coupled to the sources of the first and third transistors; and a second differential amplifier comprising fourth and fifth transistors having sources that couple together, wherein the fourth transistor includes a gate that couples to the non-inverting gate output and a drain that couples to the gate of the third transistor.

13. The logic gate of claim 12, wherein the first and second transistors provide an OR function for input signals applied to the gates of the transistors.

14. The logic gate of claim 12, wherein the fifth transistor includes a gate that couples to a bias voltage.

15. The logic gate of claim 12, wherein the fifth transistor includes a gate that couples to the inverting gate output.

16. The logic gate of claim 12, further comprising:

a third differential amplifier comprising sixth and seventh transistors having sources that couple together, gates that respectively couple to the inverting and non-inverting gate outputs, and drains that respectively couple to the non-inverting and inverting gate outputs.

17. The logic gate of claim 12, further comprising:

active loads for the first and third differential amplifier.

18. The logic gate of claim 12, further comprising:

resistive loads for the first and third differential amplifier, wherein each resistive load is configured to provide a particular signal swing.

19. The logic gate of claim 12, wherein the transistors are implemented in complementary metal oxide semiconductor (CMOS).

20. A method for providing an output signal that is a particular logic function of a plurality of input signals, the method comprising:

receiving the plurality of input signals;

forming an initial value for the output signal based on the plurality of input signals and in accordance with the particular logic function;

sensing the initial value on the output signal;

forming a feedback value based on the sensed value; and driving the output signal to a final value based at least in part on the feedback value.

21. The method of claim 20, wherein the feedback value provides positive feedback for driving the output signal to the final value.

22. The method of claim 20, wherein the final value on the output signal is based on an OR of the plurality of input signals.

* * * * *